United States Patent
Hwang et al.

(10) Patent No.: US 9,977,082 B2
(45) Date of Patent: May 22, 2018

(54) SYSTEM AND METHOD FOR DETECTING FUSION OF RELAY OF A BATTERY WHEN ENGAGING OR DISENGAGING THE IGNITION OF VEHICLE

(71) Applicants: Hyundai Motor Company, Seoul (KR); Kia Motors Corporation, Seoul (KR)

(72) Inventors: Do Sung Hwang, Gyeonggi-do (KR); Hyun Soo Park, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 129 days.

(21) Appl. No.: 14/944,077

(22) Filed: Nov. 17, 2015

(65) Prior Publication Data
US 2017/0089982 A1    Mar. 30, 2017

(30) Foreign Application Priority Data
Sep. 25, 2015  (KR) .................. 10-2015-0136603

(51) Int. Cl.
*G01R 31/327*  (2006.01)
*B60L 11/18*   (2006.01)

(52) U.S. Cl.
CPC ...... *G01R 31/3278* (2013.01); *B60L 11/1851* (2013.01)

(58) Field of Classification Search
None
See application file for complete search history.

(56) References Cited

U.S. PATENT DOCUMENTS

| | | | |
|---|---|---|---|
| 2013/0009598 A1* | 1/2013 | Ohtomo | H02J 7/0031 320/109 |
| 2013/0090793 A1 | 4/2013 | Hwang et al. | |
| 2013/0093427 A1 | 4/2013 | Bernrich et al. | |
| 2015/0209720 A1 | 7/2015 | Komatsu et al. | |

(Continued)

FOREIGN PATENT DOCUMENTS

| | | |
|---|---|---|
| EP | 2667209 A2 | 11/2013 |
| JP | 2005-116485 A | 4/2005 |
| KR | 10-1241168 B1 | 3/2013 |

(Continued)

OTHER PUBLICATIONS

Extended European Search Report for European Application No. 15185318.9, dated Feb. 24, 2017, 8 pages.

*Primary Examiner* — Jermele M Hollington
*Assistant Examiner* — Douglas X Rodriguez
(74) *Attorney, Agent, or Firm* — Mintz Levin Cohn Ferris Glovsky and Popeo, P.C.; Peter F. Corless

(57) ABSTRACT

A system and method for detecting a fusion of a relay of a battery is provided. The method includes detecting the fusion of the relay during disengagement of an ignition of a vehicle and determining the fusion status of the relay during engagement of the ignition of the vehicle. The method includes adjusting a first relay to an off position, after disengaging an ignition, and determining whether the fusion status of first relay based on measuring a voltage of an interval between the adjusting the first relay to an off position and adjusting a second relay to an off position. Then the second relay may be adjusted to the off position.

5 Claims, 4 Drawing Sheets

(56) References Cited

U.S. PATENT DOCUMENTS

2015/0231976 A1* 8/2015 Byun .................... B60L 3/0084
320/109

FOREIGN PATENT DOCUMENTS

| KR | 10-2013-0126046 A | 11/2013 |
| KR | 2013-0126146 A | 11/2013 |
| KR | 10-2014-0025627 A | 3/2014 |
| KR | 10-1470254 B1 | 12/2014 |

* cited by examiner

SYSTEM AND METHOD FOR DETECTING FUSION OF RELAY OF A BATTERY WHEN ENGAGING OR DISENGAGING THE IGNITION OF VEHICLE

CROSS-REFERENCE TO RELATED APPLICATION

This application is based on and claims the benefit of priority to Korean Patent Application No. 10-2015-0136603, filed on Sep. 25, 2015 in the Korean Intellectual Property Office, the disclosure of which is incorporated herein in its entirety by reference.

TECHNICAL FIELD

The present disclosure relates to a system and method for detecting a fusion of a relay of a battery, and more particularly, to controlling an operation of a relay when engaging or disengaging the ignition of a vehicle.

BACKGROUND

Typically, eco-friendly vehicles use an electric motor as a driving source of a vehicle, and substantial development efforts have been invested in developing a technology for storing electric energy such as a battery, or the like, which provides a power source for the eco-friendly vehicle. Further, substantial effort has been invested in research and development of internal and external apparatuses of the vehicle for charging the battery and charging equipment, and developing a charge infrastructure.

Generally, eco-friendly vehicle such as an electric vehicle or a hybrid vehicle are mounted with an electric motor, which is the driving source of the vehicle, a motor controller unit (MCU) that includes an inverter for driving and operating the electric motor, a battery for supplying driving power of the electric motor, and an in-vehicle charger for charging the battery, and a charging port that connects the vehicle and an external charger to each other. Additionally, the vehicle includes a battery management system (BMS) that monitors a state of the battery. The battery management system collects state information of the battery such as a voltage, a current, a temperature, a state of charge (SOC), etc., of a battery pack, and provides the collected state information of the battery to internal and external controllers of the vehicle to be used for a vehicle control, a charge control, or the like.

Furthermore, the battery of the eco-friendly vehicle may be slowly charged by connecting alternating current (AC) power to the vehicle, or may be rapidly charged by connecting direct current (DC) power to the vehicle. When a slow charger supplies the AC power to the vehicle, an on-board charger (OBC) within the vehicle converts the AC power into the DC power and charges the battery with the DC power. Conversely, when a rapid charger, which is a charger configured to convert the AC power into the DC power and supplies the DC power to the vehicle, and directly connects the battery in the vehicle to provide a high current, the rapid charger may complete the charge of the battery in a minimal duration of time.

To perform the charge of the battery described above, a connector of the charger (e.g. the slow charger or the rapid charger) may be connected to the charging port of the vehicle, and charged power of the charger may be supplied to the vehicle by the connector. The connector includes a plurality of terminals such as a communication terminal for a communication connection with the vehicle, a communication power supply terminal, a ground connection terminal, in addition to a power supply terminal configured to supply the charged power.

Additionally, a power line of the vehicle includes a power relay assembly (PRA) for a selective power supply and interruption. The power relay assembly includes a plurality of high voltage relays which are configured to interrupt a high voltage of a high voltage battery, and are connected to each other when engaging an ignition, and are disconnected from each other when disengaging an ignition. However, a fusion occurs that may cause the contact points of the high voltage relay to frequently be immobilized. Accordingly, there is a need for a method of detecting the fusion and performing the detection of the fusion during engagement or disengagement of the ignition.

SUMMARY

The present disclosure provides a system and method for detecting a fusion of a relay of a battery, and more particularly, for detecting of the fusion of the relay while engaging or disengaging an ignition of a vehicle.

According to an exemplary embodiment of the present disclosure, a method for detecting a fusion of a relay of a battery may include adjusting a first relay, and after disengaging an ignition (e.g., positioning the relay in the off position); determining whether the first relay is fused based on measuring a voltage of an interval between the first relay adjusted to an off position and a second relay adjusted to an off position; and then adjusting the second relay to an off position.

Some exemplary embodiments may include, determining that the first relay is not fused when the voltage decreases within an interval and measures about 0V. Further, the method may indicate fusion of the first relay when the voltage measurement maintains a level of about 0V or greater.

The method may further include, after adjusting the second relay to the off position, adjusting the second relay to the on position when the first relay is fused during the disengaging of the ignition. The first relay may be fused when a voltage measures about 0V or greater by measuring a voltage of an interval until completion of engagement of the pre-charge relay, and adjusting the second relay to the off position when the voltage measures about 0V. Following the adjustment of the second relay to an off position, an existing operation to engage the ignition may be performed. The existing operation to engage the ignition may include engaging the precharge relay; adjusting the second relay to an on position; and adjusting the first relay to an on position.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
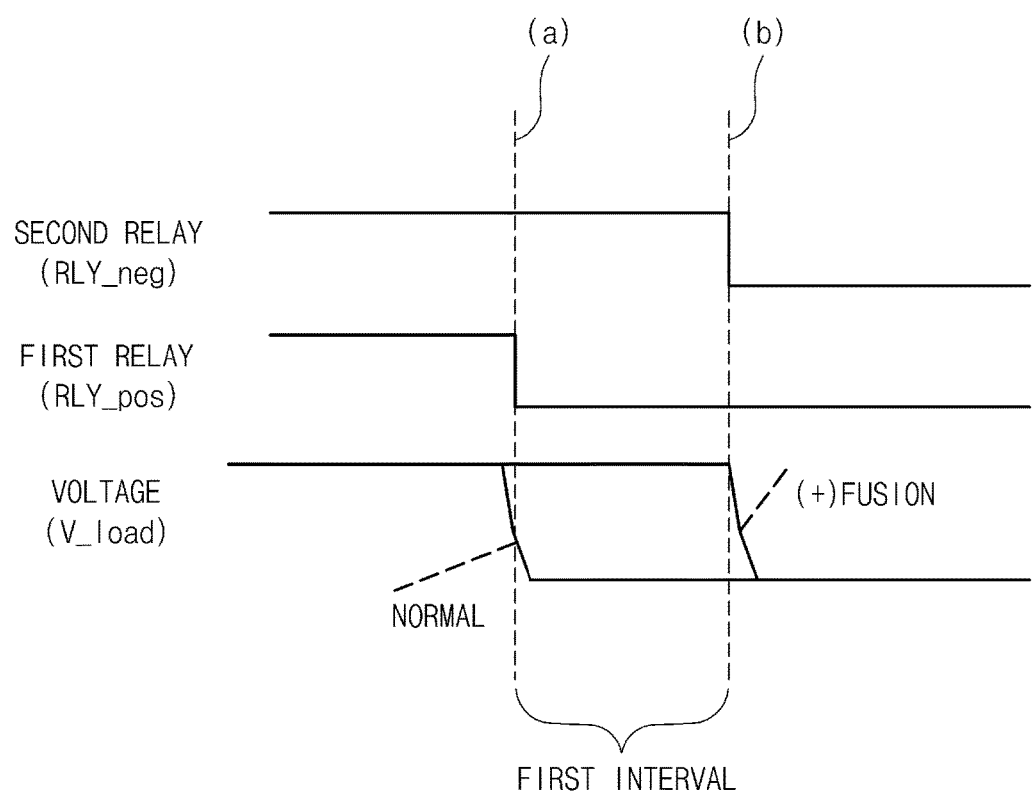
FIGS. 1 and 2 are exemplary diagrams illustrating disengaging an ignition of a vehicle for detecting a fusion of a relay of a battery according to an exemplary embodiment of the present disclosure.

Advantages and features of the present disclosure and methods to achieve them will be described from exemplary embodiments described below in detail with reference to the accompanying drawings. On the contrary, the invention is intended to cover not only the exemplary embodiments, but also various alternatives, modifications, equivalents and other embodiments, which may be included within the spirit and scope of the invention as defined by the appended claims. Throughout the drawings, the same reference numerals will refer to the same or like parts. Thus, components may be described with reference to several drawings.

In the drawings, the exemplary embodiments of the present disclosure are not limited to illustrated specific forms, but are exaggerated for clarity. In the present specification, specific terms have been used, but are just used for the purpose of describing the present disclosure and are not used for qualifying the meaning or limiting the scope of the present disclosure, which is disclosed in the appended claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Although an exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

The present disclosure relates to a technology that controls a high voltage battery that applies a relay capable of interrupting a high voltage, and based on an adjustment of the relay to an on or off position, stability of a vehicle may be increased or decreased, and the battery may be protected. The above-mentioned relay may typically be referred to as a power relay assembly. The power relay assembly may include two relays which are the main power contact points, and a precharge relay and a precharge resistor disposed on a circuit to bypass one of the two relays. For example, a first relay (e.g., a plus (+) relay) may be disposed on a circuit between a plus (+) terminal of a high voltage battery and a plus (+) terminal of a direct current (DC) link, a second relay (e.g., a minus (−) relay) may be disposed on a circuit between a minus (−) terminal of the high voltage battery and a minus (−) terminal of the DC link, and the precharge relay and the pre-charge resistor may be disposed on a bypass circuit that bypasses the first relay.

The above-mentioned relays of the power relay assembly may be to be adjusted to an on or off based on to a relay control signal output from a battery management system (BMS) or a motor controller unit (MCU). According to an exemplary embodiment, when a controller detects an ignition on input, the controller may be configured to analyze an inverter voltage (e.g., a voltage of a DC link terminal or V_load) to determine whether the relays are fused. For example, a relay control that engages an ignition may be performed to engage the pre-charge relay. In addition, the second relay may be adjusted to an on position, the first relay may be adjusted to an on position, and the pre-charge relay may be adjusted to an off position.

Figure 2:
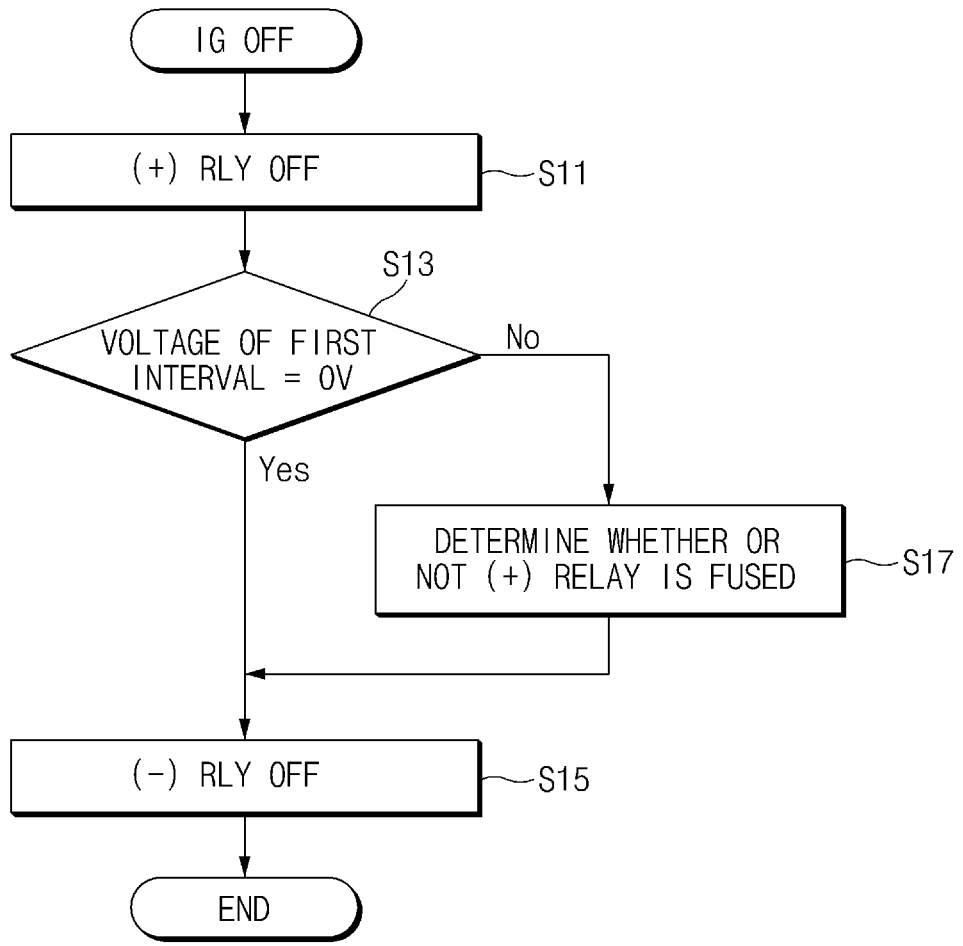

FIGS. 1 and 2 are exemplary diagrams illustrating adjusting an ignition of a vehicle to an off position for detecting a fusion of a relay of a battery according to an exemplary embodiment of the present disclosure. Referring to FIGS. 1 and 2, when a general ignition is adjusted to an off position, a normal turn-off operation of the relays may be performed by a process of simultaneously adjusting first relay and the second relay to an off position. When the general ignition is adjusted to an off position, fusion of the first relay may not be accurately determined In other words, when the first relay and the second relay are simultaneously turned-off, due to a voltage decrease at the same time as the turn-off of the two relays, it may be impossible to determine the fusion status of the first relay.

However, when the ignition disengages to detect a fusion of a relay according to an exemplary embodiment, the first relay may initially be adjusted to an off position and a voltage of a first interval may be measured. Accordingly the fusion status of the first relay may be determined based on whether the voltage varies S11 to S13. For example, the first interval may include an interval from a point (a) at which the first relay may be adjusted to an off to a point (b) at which the second relay may be adjusted to an off position. In other words, when the voltage (e.g., inverter voltage) rapidly decreases within the first interval and becomes about 0V, a process of adjusting the second relay to an off position may be sequentially performed S15. Specifically, when the voltage (e.g., inverter voltage) rapidly decreases within an entrance operation of the first interval, this may indicate that the first relay is not fused, and when the voltage (e.g., inverter voltage) does not decrease and is maintained uniformly during the first interval, the first relay may not be fused S17.

Figure 3:
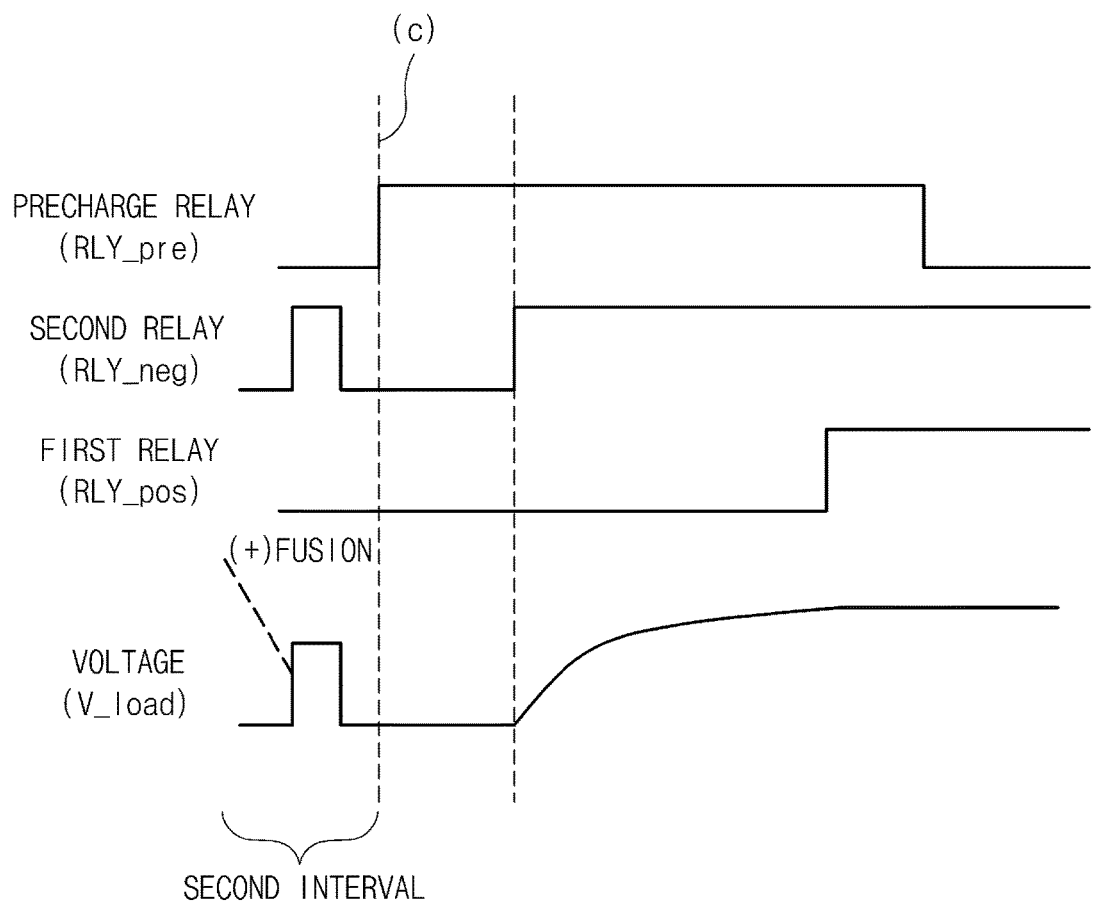
FIGS. 3 and 4 are exemplary diagrams illustrating engaging an ignition of a vehicle for detecting a fusion of a relay of a battery according to an exemplary embodiment of the present disclosure.
Figure 4:
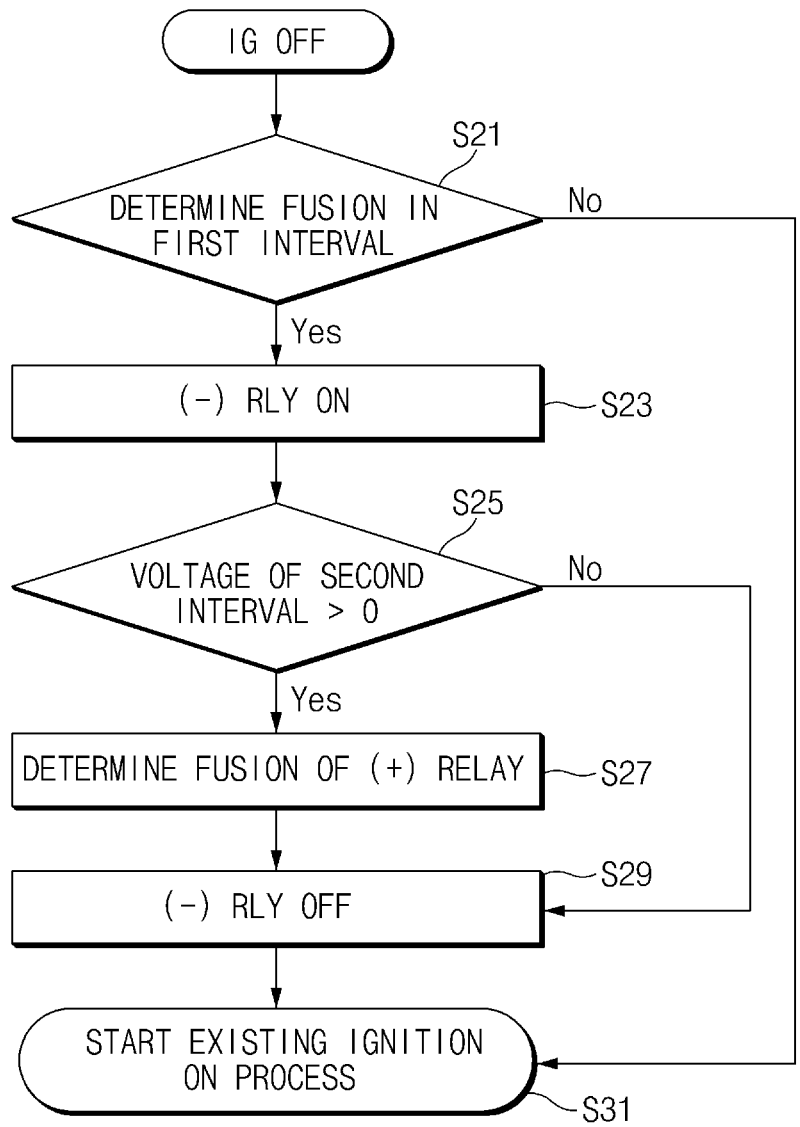

FIGS. 3 and 4 are exemplary diagrams illustrating engaging an ignition of a vehicle for detecting a fusion of a relay of a battery according to an exemplary embodiment of the present disclosure. Referring to FIGS. 3 and 4, when engaging an ignition, a normal turn-on operation of the relays may be performed by a process that engages a pre-charge relay, the second relay may be adjusted to an on position, and the first relay may then be adjusted to an on position. During the process of disengaging the ignition of the vehicle of FIGS. 1 and 2, when the first relay is fused, it whether the first relay is fused during engagement of the ignition of the vehicle may be determined. Specifically, when the first relay is fused during the disengagement of the ignition of the vehicle, the pre-charge relay may be engaged during engagement of the ignition and the second relay may then be adjusted to the on position S21 to S23.

In particular, the second relay may be adjusted to an on position, and a voltage (e.g., inverter voltage) of a second interval may be measured, thereby making it possible to determine whether the relay has been fused based on whether the voltage varies S25. For example, the second interval may include a timing (c) that engages the pre-charge relay after the engagement of the ignition. In other words, when the voltage (e.g., inverter voltage) of the second interval is equal to or greater than 0V, the first relay may be determined to be fused S27 and the second relay may be adjusted to an off position. When the voltage (e.g., inverter voltage) is about 0V, the first relay may be determined not to be fused and the second relay may be adjusted to an off position S29. Thereafter, after the second relay may be adjusted to an off position and an existing ignition engagement may be performed (S31). Further, the existing ignition engagement may include an operation of engaging the precharge relay, adjusting the second relay to an on position, and adjusting the first relay to an on position.

As described above, according to the exemplary embodiment the fusion of the first relay may be detected. Further, according to the exemplary embodiment, the first relay and the second relay may be adjusted to an off position within a time interval that corresponds to disengagement of the ignition, thereby minimizing the noise of the mechanical relay. In addition, according to the exemplary embodiment, the fusion of the first relay may be detected when disengaging the ignition and the fusion of the first relay may be determined when engaging the ignition, thereby minimizing the erroneous characterization of the fusion of the relay of the high voltage battery.

Although the present disclosure has been described with reference to specific exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A method for detecting a fusion of a relay of a battery, comprising:
adjusting, by a controller, a first relay to an off position, after disengaging an ignition; determining, by the controller, whether the first relay is fused based on measuring a voltage of an interval between after the first relay in the off position and before a second relay in an off position;
adjusting, by the controller, the second relay to the off position,
adjusting, by the controller, the second relay to an on position after engaging the ignition; and
determining, by the controller, the fusion of the first relay and adjusting the second relay to the off position based on measuring a voltage of an interval between after engaging of the ignition and before engaging of a pre-charge relay when the measured voltage is greater than 0V, and maintaining the second relay in the off position when the measured voltage is about 0V.

2. The method according to claim 1, wherein the determining of whether the first relay is fused includes determining, by the controller that the first relay is not fused when the voltage decreases within the interval and determining that the first relay is fused when the voltage does not decrease within the interval.

3. The method according to claim 1, wherein after adjusting the second relay to the off position, an engagement of the ignition is determined.

4. The method according to claim 1, wherein an engagement of the ignition includes:
engaging, by the controller, the pre-charge relay;
adjusting, by the controller, the second relay to the on position; and
adjusting, by the controller, the first relay to the on position.

5. A system for detecting a fusion of a relay of a battery, comprising:
a memory configured to store program instructions; and
a processor configured to execute the program instructions stored in the memory, the program instructions configured to:
adjusting, by a controller, a first relay adjusted to an off position, after disengaging an ignition;
determining, by the controller, whether the first relay is fused based on measuring a voltage of an interval between after the first relay in the off position and before a second relay in an off position;
adjusting, by the controller, the second relay to the off position,
adjusting, by the controller, the second relay to an on position after engaging the ignition; and
determining, by the controller, the fusion of the first relay and adjusting the second relay to the off position based on measuring a voltage of an interval between after engaging of the ignition and before engaging of a pre-charge relay when the measured voltage is greater than 0V, and maintaining the second relay in the off position when the measured voltage is about 0V.

* * * * *